(12) United States Patent
Jeng et al.

(10) Patent No.: US 6,764,905 B2
(45) Date of Patent: Jul. 20, 2004

(54) METHOD OF MANUFACTURING A SCALABLE FLASH EEPROM MEMORY CELL WITH FLOATING GATE SPACER WRAPPED BY CONTROL GATE

(75) Inventors: Ching-Shi Jeng, Los Altos Hills, CA (US); Ching Dong Wang, Cupertino, CA (US)

(73) Assignee: Integrated Memory Technologies, Inc., Santa Clara, CA (US)

( * ) Notice: Subject to any disclaimer, the term of this patent is extended or adjusted under 35 U.S.C. 154(b) by 0 days.

(21) Appl. No.: 10/616,358

(22) Filed: Jul. 9, 2003

(65) Prior Publication Data

US 2004/0105319 A1 Jun. 3, 2004

Related U.S. Application Data

(62) Division of application No. 10/005,495, filed on Nov. 6, 2001, now Pat. No. 6,621,115.

(51) Int. Cl.[7] ............................................. H01L 21/336
(52) U.S. Cl. ....................... 438/267; 438/266; 438/257; 257/315
(58) Field of Search ................................ 438/197, 257, 438/266, 267; 257/315, 318

(56) References Cited

U.S. PATENT DOCUMENTS

| | | |
|---|---|---|
| 4,462,090 A | 7/1984 | Iizuka |
| 4,698,787 A | 10/1987 | Mukherjee et al. |
| 5,029,130 A | 7/1991 | Yeh |
| 5,194,925 A | 3/1993 | Ajika et al. |
| 5,280,446 A | 1/1994 | Ma et al. |
| 5,303,187 A | 4/1994 | Yu |
| 5,338,952 A | 8/1994 | Yamauchi |
| 5,414,286 A | 5/1995 | Yamauchi |
| 5,912,843 A | 6/1999 | Jeng |
| 6,414,350 B1 | 7/2002 | Hsieh et al. |
| 6,624,465 B1 * | 9/2003 | Chien et al. ................. 257/315 |

* cited by examiner

Primary Examiner—Richard Elms
Assistant Examiner—Brad Smith
(74) Attorney, Agent, or Firm—Gray Cary Ware & Freidenrich LLP

(57) ABSTRACT

A scalable flash EEPROM cell having a semiconductor substrate with a drain and a source and a channel therebetween. A select gate is positioned over a portion of the channel and is insulated therefrom. A floating gate is a spacer having a bottom surface positioned over a second portion of the channel and is insulated therefrom. The floating gate has two side surfaces extending from the bottom surface. A control gate is over the floating gate and includes a first portion that is adjacent the floating gate first side surface, and a second portion adjacent the floating gate second side surface.

28 Claims, 14 Drawing Sheets

METHOD OF MANUFACTURING A SCALABLE FLASH EEPROM MEMORY CELL WITH FLOATING GATE SPACER WRAPPED BY CONTROL GATE

This application is a divisional of U.S. patent application Ser. No. 10/005,495, filed Nov. 6, 2001 now U.S. Pat. No. 6,621,115.

TECHNICAL FIELD

The present invention relates to an electrically erasable and programmable read-only non-volatile memory (EEPROM) cell or, more specifically, a flash EEPROM. The present invention also relates to a memory array containing a plurality of such EEPROM cells arranged in a matrix of rows and columns of such memory cells.

BACKGROUND OF THE INVENTION

One prior art flash memory device is a stack gate flash EEPROM where a single stack-gate transistor constitutes the memory cell. It programs as a traditional UV-erasable EPROM, using the mechanism of hot-electron injection to a floating gate, and erases through Fowler-Nordheim tunneling mechanism from the floating gate to the source region. Such device suffers the disadvantages of (1) over-erase sensitivity, where the memory cell can be erased to a negative threshold voltage thus rendering the cell in a conductive state even when the gate of the cell is deselected and biased at a ground potential, and (2) high programming current, which requires the memory cell to be programmed by a separate power supply voltage. See for example, U.S. Pat. No. 4,698,787.

A second type of flash memory device utilizes a split gate configuration. This eliminates the over-erase sensitivity, because even if the floating gate is over-erased, conduction in the channel requires the biasing of the control gate which is over another portion of the channel. However, the programming and erase mechanisms are the same as the stack-gate configuration. The disadvantage of this configuration is that it increases the cell size and can suffer an alignment sensitivity because of the split gate arrangement. See for example, U.S. Pat. No. 5,029,130.

Yet another type of flash memory cell utilizes the so called source-side injection technique which minimizes the hot electron programming current to the extent that an on-chip voltage multiplier can be used to provide sufficient programming current from a single 5 or 3.3 V power supply. However, the structure of these cells can still suffer from (1) alignment sensitivity, (2) poor scalability and (3) compromise between cell size and coupling ratio. See U.S. Pat. No. 5,194,925.

U.S. Pat. Nos. 5,303,187, 4,462,090 and 5,280,446 disclose a single transistor memory cell having four terminals with a select gate, a control gate, a source and a drain. The memory cell disclosed in U.S. Pat. No. 5,303,187, however, erases by tunneling of electrons from a floating gate to the substrate (see Col. 5, line 64–68). This is undesirable because of the lower coupling ratio, due to the large capacitance between the floating gate and the substrate. As a result, a higher voltage to erase is required. In addition, it requires a negative voltage to supply the potential for erase operation of an n-type cell. This requires the process to provide a high PMOS junction breakdown voltage, and a high field isolation threshold voltage and a low PMOS transistor body effect so that the circuit can provide a negative voltage of sufficient magnitude to achieve the necessary erase operation.

Each of U.S. Pat. Nos. 4,462,090 and 5,280,446 discloses a split gate configuration for the select gate. Such a split gate configuration for the select gate can cause punch through sensitivity due to misalignment.

Lastly, U.S. Pat. No. 5,338,952 discloses a split gate memory cell with a floating gate formed as a spacer that is disposed adjacent the select gate and underneath the control gate. With this configuration, however, there is an insufficient amount of capacitive coupling between the floating gate and the control gate.

SUMMARY OF THE INVENTION

The present invention is an electrically erasable and programmable memory device that includes a substrate of semiconductor material of a first conductivity type, spaced-apart first and second regions formed in the substrate and having a second conductivity type different from the first conductivity type, with a channel region therebetween, a conductive select gate formed over and insulated from the substrate with the select gate extending over a first portion of the channel, and conductive floating and control gates. The floating gate is formed as a spacer over and insulated from the substrate, and includes a bottom surface extending over a second portion of the channel region, and first and second side surfaces extending from the bottom surface. The control gate is formed over and insulated from the floating gate, and includes a first portion disposed adjacent to the first floating gate side surface, and a second portion disposed adjacent to the second floating gate side surface.

In another aspect of the present invention, a method of making a memory device on a semiconductor substrate of a first conductivity type includes the steps of forming spaced-apart first and second regions in the substrate that have a second conductivity type different from the first conductivity type, wherein a channel region is defined in the substrate between the first and second regions, forming a conductive select gate over and insulated from the substrate, wherein the select gate extends over a first portion of the channel and has a first height, forming a conductive floating gate spacer over and insulated from the substrate, and forming a conductive control gate over and insulated from the floating gate. The floating gate includes a bottom surface extending over a second portion of the channel region, and first and second side surfaces extending from the bottom surface to a height greater than the first height. The control gate includes a first portion disposed adjacent to the first floating gate side surface and a second portion disposed adjacent to the second floating gate side surface.

In yet another aspect of the present invention, a method of making a memory device on a semiconductor substrate of a first conductivity type includes the steps of forming spaced-apart first and second regions in the substrate that have a second conductivity type different from the first conductivity type, wherein a channel region is defined in the substrate between the first and second regions, forming a first layer of insulating material on substrate, forming a select gate on the first insulating layer, wherein the select gate is positioned over a first portion of said channel, forming a second layer of insulating material on the select gate, forming a layer of material on the second layer of insulating material, forming a floating gate spacer of conductive material adjacent to and insulated from the select gate and adjacent to the layer of material, removing the layer of material, and forming a conductive control gate over and insulated from the floating gate and over the second insulating layer. The floating gate includes a bottom surface extending over a second portion of the channel region, and first and second side surfaces extending from the bottom surface. The control gate includes a first portion disposed adjacent to and insulated from the first floating gate side surface and a second portion disposed adjacent to and insulated from the second floating gate side surface.

In still yet another aspect of the present invention, a method of designing an electrically erasable and programmable memory device formed on a substrate of semiconductor material of a first conductivity type is used to form a device that includes spaced-apart first and second regions formed in the substrate with a second conductivity type different from the first conductivity type and with a channel region therebetween, a conductive select gate formed over and insulated from the substrate and extending over a first portion of the channel, a conductive floating gate formed as a spacer over and insulated from the substrate and having a bottom surface extending over a second portion of the channel region and first and second side surfaces extending from the bottom surface, and a conductive control gate formed over and insulated from the floating gate with a first portion disposed adjacent to the first floating gate side surface and a second portion disposed adjacent to the second floating gate side surface. The improvement steps include selecting a desired capacitive coupling ratio between the floating gate and the control gate and adjusting a height of the control gate second portion to achieve the desired capacitive coupling ratio.

In yet one more aspect of the present invention, an electrically erasable and programmable memory device includes a substrate of semiconductor material of a first conductivity type, spaced-apart first and second regions formed in the substrate and having a second conductivity type different from the first conductivity type, with a channel region therebetween, a conductive select gate formed over and insulated from the substrate, the select gate extending over a first portion of the channel, a conductive floating gate formed as a spacer over and insulated from the substrate, and a conductive control gate formed over and insulated from the floating gate. The floating gate includes a bottom surface extending over a second portion of the channel region, and first and second side surfaces extending from the bottom surface. The control gate includes a first portion disposed adjacent to the first floating gate side surface, and a second portion disposed adjacent to the second floating gate side surface. The control gate is formed by the process of selecting a desired capacitive coupling ratio between the floating gate and the control gate, and forming the control gate second portion with a predetermined height for achieving the desired capacitive coupling ratio.

Other objects and features of the present invention will become apparent by a review of the specification, claims and appended figures.

DETAILED DESCRIPTION OF THE PREFERRED EMBODIMENTS

Memory Cell Fabrication

FIGS. 1A to 1E illustrate a method of fabricating a non-volatile memory cell according to the present invention. The parameters described hereinafter depend upon the design rules and the process technology generation. It will be understood by those skilled in the art that the present invention is not limited to any specific process technology generation, nor to any specific value in any of the process parameters described hereinafter. In addition, the following method description focuses on the formation of a single memory cell, when in fact a plurality of such cells are formed simultaneously that extend end to end in active regions arranged in columns. Columns of such memory cells are separated by columns of insulation areas, the formation of which is well known in the art.

Figure 1A:
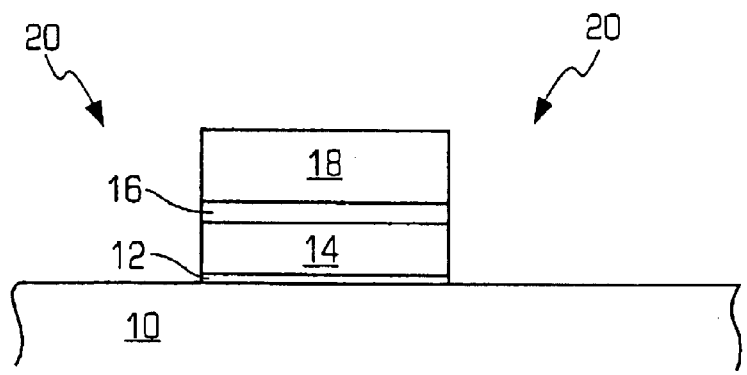
FIGS. 1A to 1E are cross sectional views of a substrate showing in sequence the processing steps used to fabricate the memory cell of the present invention.
Figure 1B:
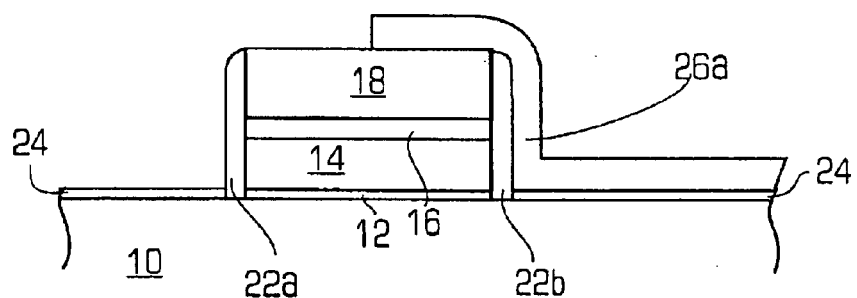

FIG. 1A illustrates a cross sectional view of a semiconductor substrate (or substrate well) 10, which is preferably of P conductivity type and is well known in the art. A first layer of insulation material 12, preferably silicon dioxide (hereinafter "oxide"), is formed on the substrate 10 by well known techniques such as oxidation or oxide deposition (e.g. chemical vapor deposition or CVD), having a depth of approximately 50 Å. A layer of polysilicon 14 (hereinafter "poly") is formed on top of oxide layer 12. The formation of poly layer 14 can be made by a well known process such as Low Pressure CVD or LPCVD. The polysilicon is properly doped either through an in-situ method or by conventional implantation. In the preferred embodiment, poly layer 14 has a depth of approximately 1000 Å, and is implanted with $P_{31}$ (2.5 E15 dose, 15 KeV implant energy). A second layer of insulation material 16 is formed over the poly layer 14, preferably by an HTO oxide deposition process. Oxide layer 16 has a depth of approximately 700 Å. A layer of silicon nitride 18 (hereinafter "nitride") is then deposited over the oxide layer 16 (~1000 Å thickness). A suitable photo-resistant material is then applied on the nitride layer 18, and a masking step is performed to selectively remove the photo-resistant material from certain masking regions (stripes 20 extending in a row direction across multiple columns of active regions). Where the photo-resist material is removed, the underlying portions of nitride layer 18, oxide layer 16, and poly layer 14 are etched away in stripes 20 using standard etching techniques (i.e. anisotropic etch processes). Where the photo resist is not removed, the layers of nitride 18, oxide 16, and poly 14 are maintained. The remaining photo resistant material is removed, followed by a wet oxide etch to removed exposed portions of oxide layer 12, to result in the structure shown in FIG. 1A.

Insulation spacers 22a and 22b are then formed along the side wall surfaces of remaining structure. Formation of spacers is well known in the art, and involves the deposition of a material over the contour of a structure, followed by an anisotropic type etch process, whereby the material is removed from horizontal surfaces of the structure, while the material remains largely intact on vertically oriented surfaces of the structure. Spacers 22a and 22b can be formed of any dielectric material. In the structure illustrated in FIG. 1B, insulation spacers 22a/22b are formed by depositing a layer of oxide on exposed surfaces of the structure (~550 Å thickness using an HTO deposition process), followed by an anisotropic oxide etch process, such as Reactive Ion Etch (RIE), which removes the deposited oxide except for the spacers 22a/22b. The structure is then oxidized, which forms an oxide layer 24 (~90 Å thick) on the exposed portions of the substrate 10. A poly layer segment 26a is then formed over the structure by depositing a layer of polysilicon over the structure (~800 Å thick), implanting the polysilicon with $P_{31}$ (4 E14 dose, 15 KeV implant energy), performing a masking step that covers half of the poly layer with photo-resist, and performing an anisotropic poly etch process which removes the exposed polysilicon while leaving poly layer segment 26a. The photo-resist material is removed to result in the structure shown in FIG. 1B.

Figure 1C:
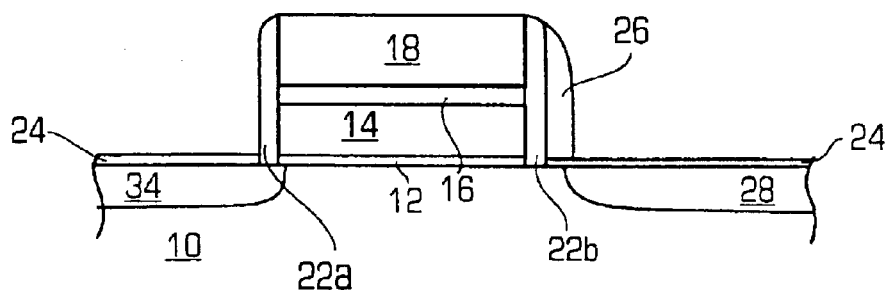

A poly etch is then used to remove most of poly layer segment 26a, except for poly spacer 26 (adjacent oxide spacer 22b). Poly spacer 26 forms the floating gate for the memory cell. Suitable ion implantation is then made across the entire surface of the structure (5 E13 of $P_{31}$ at 30 KeV, 15°; and 2 E15 of As at 60 KeV, 0°). Where the ions have sufficient energy to penetrate the exposed oxide layer 24 (immediately adjacent to the poly spacer 26 on one side and the oxide spacer 22a on the other side), they then simultaneously form a first region (i.e. source region) 28 and a second region (i.e. drain region) 34 in the substrate 10. The source and drain regions 28/34 have a conductivity type (e.g. N doped) that is different from that of the substrate 10 (e.g. P doped). In this case, the source and drain regions are N+ doped. The resulting structure is shown in FIG. 1C.

Figure 1D:
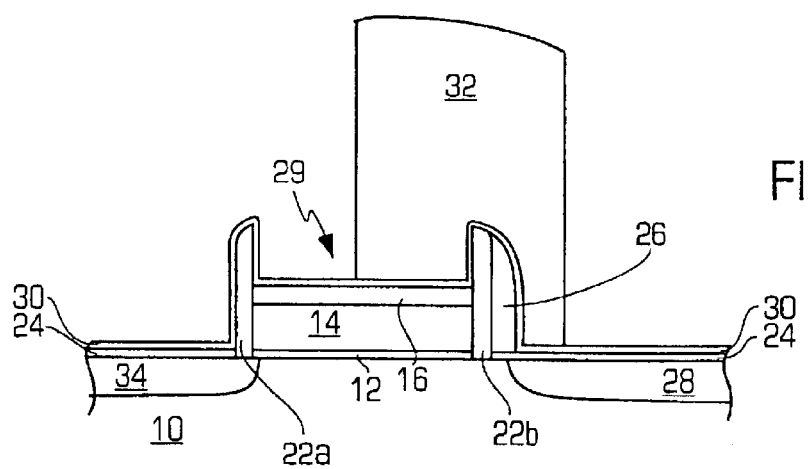

Referring now to FIG. 1D, a nitride etch process is used to remove nitride layer 18 (e.g. hot $H_3PO_4$), leaving behind a recess 29 over oxide layer 16 and between spacers 22a/22b. An ONO layer 30 is then formed over the structure, which includes three thin layers of successively deposited insulation materials (oxide, nitride and oxide; with thicknesses of ~60 Å, ~70 Å, ~60 Å, respectively). A thick layer of polysilicon is then deposited over the structure (~2200 Å), which fills recess 29. A masking step follows to protect that portion of the deposited polysilicon that surrounds, but is insulated from, poly spacer 26. The unprotected portion of the deposited polysilicon is removed in a poly etch step, leaving poly block 32 that wraps around poly spacer 26 (and fills a portion of the recess 29). Specifically, poly block 32 is disposed adjacent to one side of poly spacer 26 (insulated therefrom by ONO layer 30), is disposed over poly spacer 26 (insulated therefrom by ONO layer 30), and is disposed adjacent to the other side of poly spacer 26 (insulated therefrom by ONO layer 30 and oxide spacer 22b). The resulting structure is shown in FIG. 1D.

A (TEOS) oxide layer 36 is deposited over the structure shown in FIG. 1D. A thick layer of nitride is then deposited over the structure, followed by an nitride etch that removes the deposited nitride except for nitride spacers 38a (adjacent to oxide spacer 22a) and 38b/38c (adjacent to poly block 32). A series of oxide and nitride etches are performed to remove exposed portions of oxide layer 36 and ONO layer 30, as well as oxide layer 24 over the substrate. Additional ion implantation is performed to create higher N+ dopant regions in the source 28 and drain 34 (5 E15 of As at 50 KeV, 7°; $N_2$ anneal at 950° C. for 60 seconds). The resulting structure is shown in FIG. 1E.

Figure 1E:
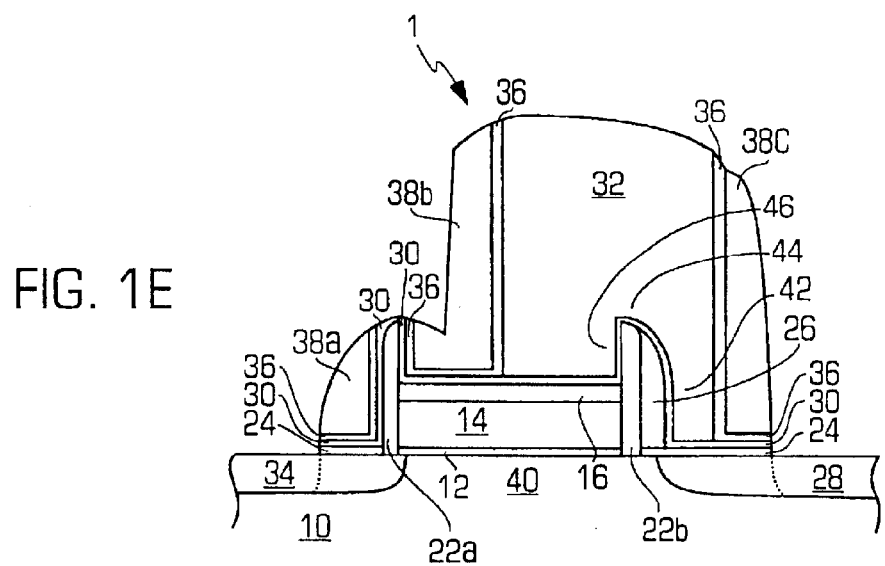

FIG. 1E illustrates the final structure of the memory cell 1 of the present invention. A channel region 40 is defined in the substrate between the source 28 and drain 34. Poly layer 14 forms the cell's select gate, which is disposed over and insulated from a first portion of the channel region 40. Poly spacer 26 forms the cell's floating gate, which is disposed over and insulated from a second portion of the channel region 40. Poly block 32 forms the cell's control gate, which includes a first portion 42 disposed adjacent to a first side of floating gate 26, a second portion 44 disposed over floating gate 26, and a third portion 46 disposed adjacent to a second side of floating gate 26 that opposes the floating gate first side.

Figure 1F:
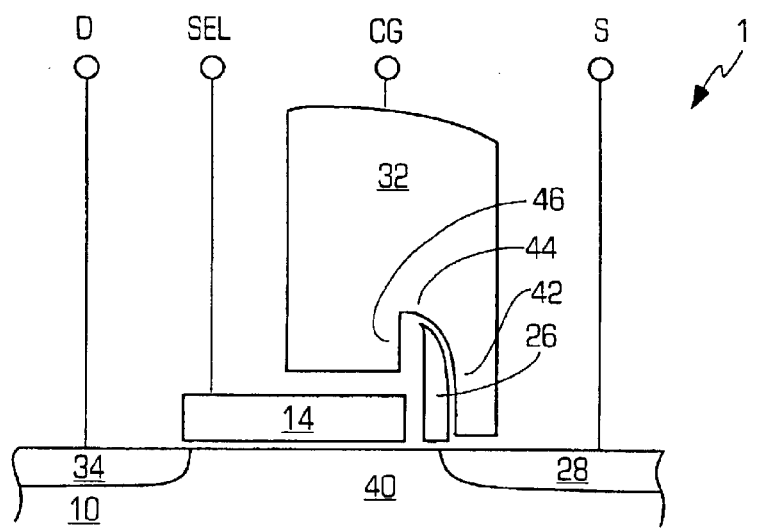
FIG. 1F is a schematic cross sectional view the memory cell of the present invention.

FIG. 1F is a simplified schematic cross sectional view showing the five conductive components of the memory cell 1 (select gate 14, floating gate 26, control gate 32, source 28 and drain 34), which are insulated from each other by one or more layers of insulating materials. The memory cell 1 is controlled by voltages supplied to the select gate 14, control gate 32, source 28, and drain 34 by terminals SEL, CG, S and D, respectively.

Memory Cell Operation

The operation of a three poly memory cell is described in U.S. Pat. No. 5,912,843, whose disclosure is incorporated herein by reference.

Memory Cell Erase or Write "1"

To write a "1" or to erase a memory cell 1, which causes the memory cell 1 to be in a conductive state, a high voltage (~12 V) is applied to the source 28. The drain 34, select gate 14 and control gate 32 are all at ground potential. Because of the high capacitive couplings between the floating gate 26 and the select gate 14, and between the floating gate 26 and the control gate 32, and because of a fairly small capacitive coupling between the source region 28 and the floating gate 26, and because of the overlap between the source region 28 and the floating gate 26, a large percentage of the applied voltage appears across the source 28 and floating gate 26. This causes the electrons to tunnel from the floating gate 26 to the source 28, but not to the substrate, through the Fowler-Nordheim tunneling mechanism, leaving the floating gate 26 with a relatively positive charge.

With source voltage at 12 V, a band-to-band tunneling mechanism may occur at the source junction which will increase the magnitude of the source current. Since an on-chip voltage multiplier is usually used for supplying the high voltage, the band-to-band tunneling current will require a more robust voltage multiplier design.

An alternative way to erase the cell 1 is to apply a negative bias (~-8 to -10 V) to the control gate 32, while holding the select gate 14 at ground potential or the same negative bias as the control gate 32, and raise the voltage at the source 28 only to 5 V or close to Vcc, such as 6-7 V. The advantage of this approach is that the source voltage is now at a lower potential. By reducing the source voltage, it allows one to supply the source voltage either directly from the Vcc power supply or from a voltage multiplier with fewer pumping stages for higher current supply capability.

Memory Cell Program or Write "0"

To write a "0" to a memory cell 1, which causes the memory cell 1 to be in a non-conductive state, a high voltage (~5 to 8 V) is applied to the source 28. A second high voltage (~10 to 12 V) is applied to the control gate 32. The drain voltage is kept at 0 V or a small bias voltage (~0.3 to 1.0 volts). A small voltage which is just above the threshold voltage Vt of the transistor under the select gate 14 (e.g. Vt+$\Delta$V where $\Delta$V~0.1 V to 0.5 V) is applied to the select gate 14. The voltage at the select gate 14 causes the transistor to conduct a small current, on the order of micro amperes, from drain 34 to source 28. Because of the high voltages which are applied the control gate 32 and source region 28, the potential at the floating gate 26 is coupled high. The high potential of the floating gate 26 will cause the channel region below the floating gate 26 to be pulled high. The surface potential of the substrate 10 immediately below the left edge of the floating gate 26, is estimated to be about one volt below the floating gate voltage (~8 V). Due to the fact that the select gate 14 is biased to just above the threshold voltage, the channel potential below the select gate 14 is close to that of the drain voltage, which is 0 V or a small bias voltage, as discussed previously. Hence a voltage differential of approximately 8 V is developed across the region in the channel 40 immediately below the select gate 14 and the region in the channel 40 immediately below the floating gate 26. The width of the gap between the region of the channel immediately below the select gate 14 and the region of the channel immediately below the floating gate 26 is approximately 500 Å. An electric field of 1.5 to 4 MV/cm is thus developed, which is high enough to cause hot electron injection from the channel 40 to the floating gate 26, which leaves the floating gate 24 negatively charged.

Memory Cell Read

Finally, to read the memory cell 1, ground potential is applied to the source region 28. A read voltage of approximately 1 volt is applied to the drain region 34 and a Vcc voltage (e.g. ~1.8 volts for 0.18 $\mu$m technology) is applied to the select gate 14. If the floating gate 26 is positively charged (i.e. the floating gate is discharged of electrons), then the channel region directly underneath the floating gate 26 is turned on. When the select gate 14 is raised to the read potential, the channel region directly under the select gate 14 is also turned on. Thus, the entire channel region 40 will be turned on, causing electrons to flow from the source region 28 to the drain region 34. This conductive state would be sensed as the memory erased "1" state.

On the other hand, if the floating gate 26 is negatively charged, the channel region directly below the floating gate 26 is either weakly turned on or is entirely shut off. Even when the select gate 14 and the drain region 34 are raised to the read potentials, little or no current will flow through the channel 40. In this case, either the current is very small compared to that of the "1" state or there is no current at all. This non-conductive state would be sensed as the memory programmed "0" state.

The capacitive coupling elements of the memory cell 1 are formed by the overlapping areas between the floating gate 26 and the control gate 32, and between the source region 28 and the floating gate 26. These areas are either vertically stacked or formed along adjacent side walls. The amount of coupling is dictated by the amount of overlapping area, and the thicknesses of the insulating material therebetween. The present invention utilizes a control gate 32 that wraps around the floating gate spacer 26 for enhanced coupling therebetween. As stated above, control gate 32 includes a first portion 42 disposed adjacent to a first side of floating gate 26, a second portion 44 disposed over floating gate 26, and a third portion 46 disposed adjacent to a second side of floating gate 26 that opposes the floating gate first side. This configuration has several advantages. First, by wrapping the control gate around the spacer that forms the floating gate, enhanced coupling therebetween is achieved. Second, the floating gate spacer height can be controlled by adjusting the thicknesses of oxide layer 16 and nitride layer 18. Third, the amount of capacitive coupling between the floating gate spacer and control gate can be controlled by adjusting the thickness of oxide layer 16 (relative to nitride layer 18), which in turn directly defines the size of control gate portion 46 (i.e. its surface area size) that couples to the second side of the floating gate spacer 26. This is important because as the memory cell dimensions are scaled down, the junction breakdown voltage decreases. Thus, there is a need to adjust the capacitive coupling ratio to match the lower voltages used with smaller devices. The present invention, therefore, is scalable given its enhanced and adjustable capacitive coupling between the floating and control gates. Finally, with prior art devices, the source region is typically formed deeper than, and thus formed in a separate fabrication step from, the drain region in order to accommodate a relatively high erase voltage. With the present invention, because of the increased capacitive coupling between the control gate and floating gate, the voltage applied to the source region during an erase operation need not be as high. Therefore, the source and drain regions of the present invention can have the same depth, and can be formed using the same ion implant step.

First Alternate Embodiment

Figure 2A:
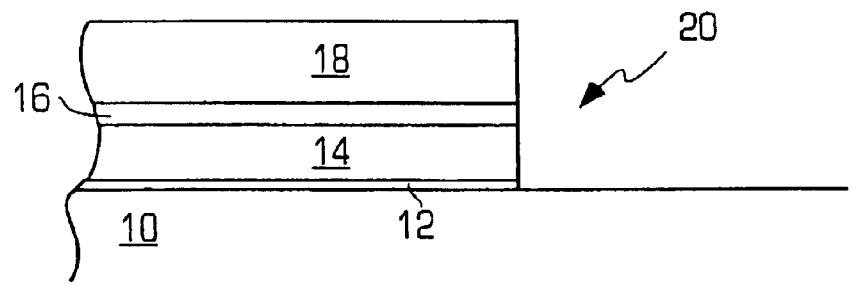
FIGS. 2A to 2E are cross sectional views of a substrate showing in sequence a first alternate embodiment of the processing steps used to fabricate the memory cell of the present invention.

FIGS. 2A to 2F illustrate an alternate method of fabricating an alternate embodiment of the non-volatile memory cell structure shown in FIG. 1E. This alternate method uses many of the same processing steps and parameters as disclosed above, with exceptions noted below. The first alternate method begins with the same materials depositions steps for forming the layered structure of oxide 12, poly 14, oxide 16 and nitride 18 over the substrate 10. However, unlike the previously described method that performs a masking step to etch away material from masking regions 20 on both sides of the layered structure, only a single masking region 20 is defined on one side of the layered structure from which the layered materials are removed, as shown in FIG. 2A.

Figure 2B:
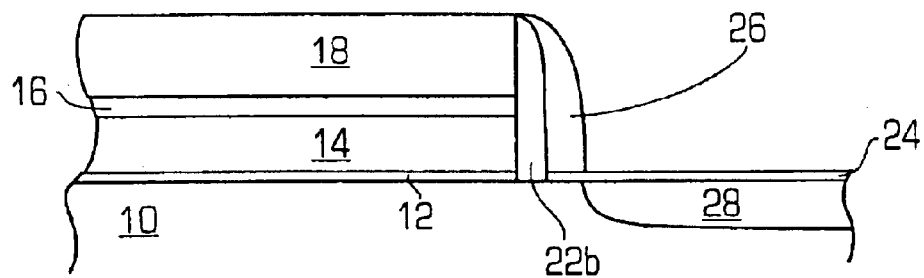

Insulation spacer 22b is formed along the side wall surface of remaining layered structure by depositing a layer of oxide followed by an anisotropic oxide etch process, which removes the deposited oxide except for spacer 22b. The structure is then oxidized to form layer 24 on the exposed portions of the substrate 10. Poly spacer (floating gate) 26 is then formed in the same way as in the first embodiment (poly layer deposit, $P_{31}$ implant, masking step, anisotropic poly etch, photo-resist removal, and another anisotropic poly etch). Suitable ion implantation is then made to form the first (source) region 28 in the substrate portion not protected by the layered structure or spacers 22b/26. The resulting structure is shown in FIG. 2B.

Figure 2C:
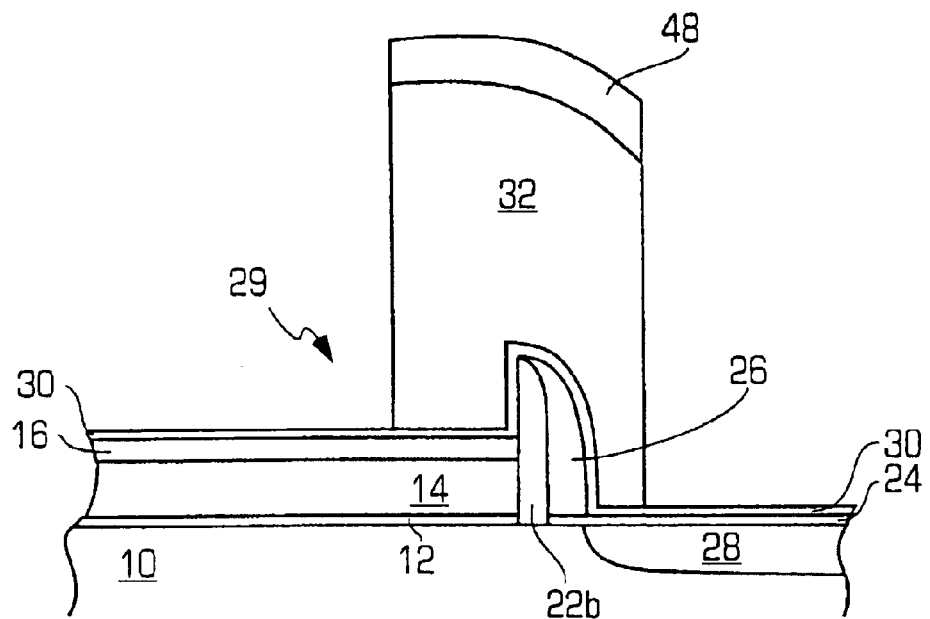
Figure 2D:
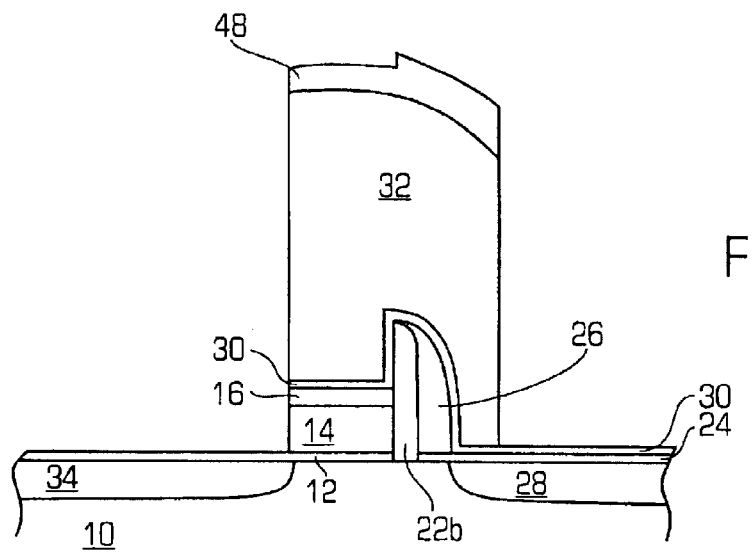

Referring now to FIG. 2C, a nitride etch process is used to remove nitride layer 18, leaving recess 29 over oxide layer 16 and extending away from oxide spacer 22b. The ONO layer 30 is then formed over the structure, followed by the deposition of a thick layer of polysilicon 32. A layer of nitride 48 (~1000 Å) is then formed over the deposited polysilicon layer 32. A masking step follows to protect that portion of the deposited polysilicon that surrounds poly spacer 26. The unprotected portions of the deposited nitride 48 and polysilicon 32 are removed in nitride and poly etch steps, leaving poly block 32 (and nitride layer 48 thereon) disposed over and adjacent to poly spacer 26 (and filling a portion of recess 29). The resulting structure is shown in FIG. 2C.

Next, a masking step is performed to protect the portions of the ONO and oxide layers 30/24 disposed over the source region 28 (the protective masking also extends over part of the nitride layer 48). A series of etch steps are then performed to remove portions of ONO layer 30, oxide layer 16, and poly layer 14 (exposing portion of oxide layer 12) that are not protected by the masking step or nitride layer 48. These etching steps also remove a portion of nitride layer 48. The low dopant second (drain) region 34 is then formed in the substrate 10 by ion implant (the masking material from the masking step continues to protect the source region 28 of substrate 10). The masking material is removed to result in the structure shown in FIG. 2D.

Figure 2E:
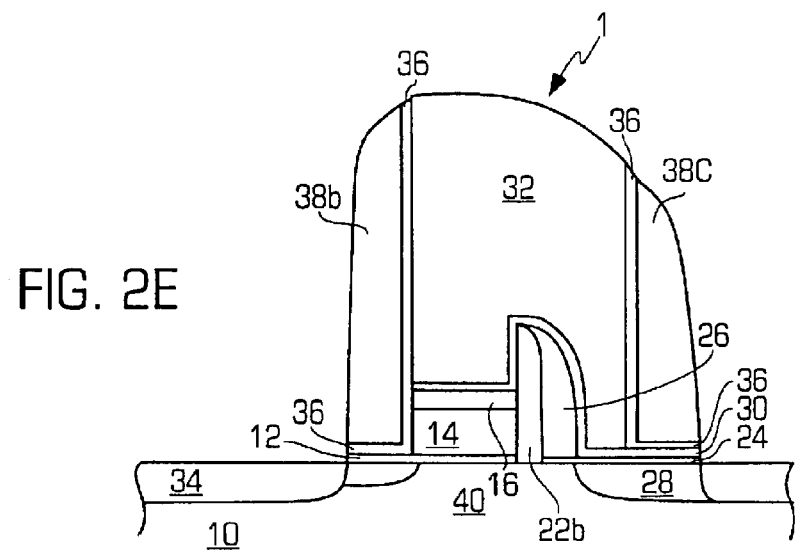
Figure 2F:
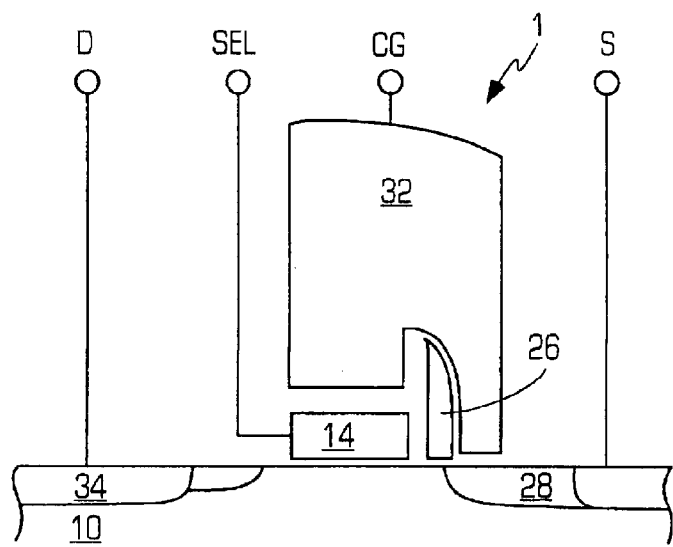
FIG. 2F is a schematic cross sectional view the memory cell of the present invention fabricated by the first alternate embodiment of the processing steps of the present invention.

A hot $H_3PO_4$ acid is used to remove the remaining portion of nitride layer 48. An oxide layer 36 is then deposited over the structure of FIG. 2D. Nitride spacers 38b and 38c are formed adjacent to poly block 32 and against oxide layer 36 by a nitride deposition and etch back process. A series of oxide and nitride etches follow to remove the exposed portions of layers 36, 12, 30, and 24. Additional ion implantation and anneal is performed to create higher N+ dopant regions in the source 28 and drain 34. The final memory cell structure is shown in FIG. 2E and FIG. 2F (simplified view showing five conductive memory cell components). One additional advantage of this alternate embodiment is that the side edges of poly block 32 and select gate 14 over drain region 34 are self aligned to each other, which is a better fit for forming a self-aligned contact (SAC) to the drain region 34.

Second Alternate Embodiment

Figure 3A:
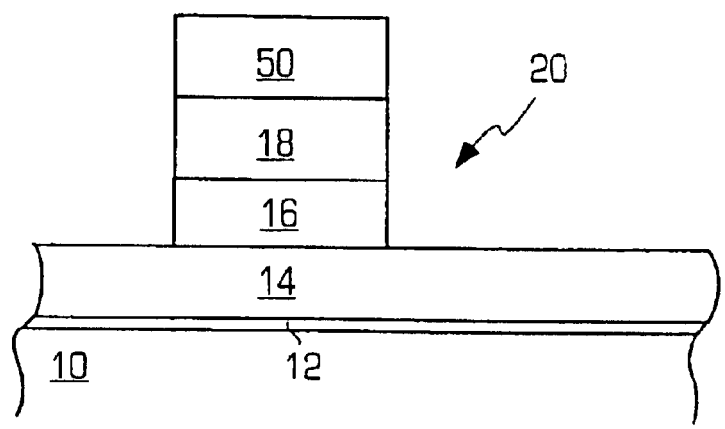
FIGS. 3A to 3H are cross sectional views of a substrate showing in sequence a second alternate embodiment of the processing steps used to fabricate the memory cell of the present invention.

FIGS. 3A to 3I illustrate a second alternate method of fabricating a second alternate embodiment of the non-volatile memory cell structure having a portion of the floating gate overlapping with the select gate. This second alternate method uses many of the same processing steps and parameters as disclosed above with regard to FIGS. 1A to 1F, with exceptions noted below. The second alternate method begins with the same materials depositions steps for forming the layered structure of oxide 12, poly 14, oxide 16 (~1000 Å) and nitride 18 over the substrate 10. A suitable photo-resistant material 50 is then applied on the nitride layer 18, and a masking step is performed to selectively remove the photo-resistant material from the masking stripes 20 on both sides of the layered structure. Where the photo-resist material is removed, the underlying nitride 18 and oxide 16 are etched away in stripes 20 using standard etching techniques (i.e. anisotropic etch processes using poly layer 14 as the etch stop). Where the photo resist 50 is not removed, the layers of nitride 18 and oxide 16 are maintained. The resulting structure is shown in FIG. 3A.

Figure 3B:
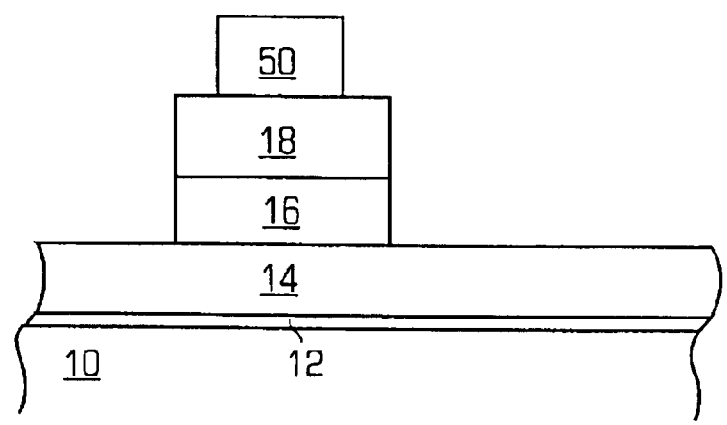
Figure 3C:
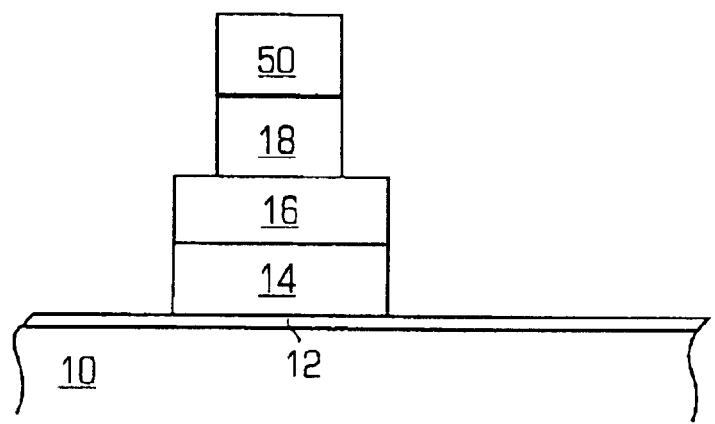
Figure 3D:
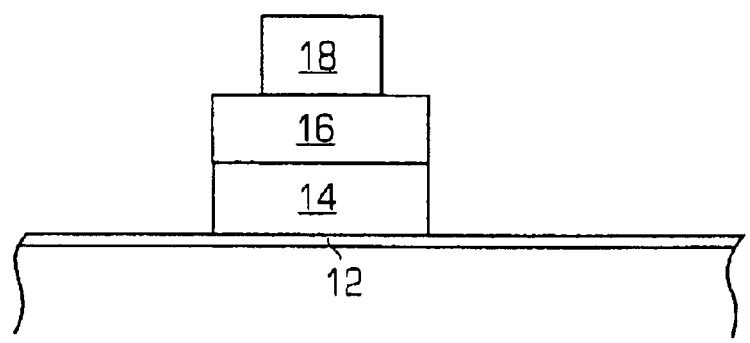

A plasma etching process (ashing) follows, which removes the exposed surfaces of the photo resist 50 on top of nitride layer 18. This etching process results in reducing the width of the photo resist 50 by about 600 Å, leaving portions of nitride layer 18 exposed, as shown in FIG. 3B. A nitride etch follows to remove the exposed side portions of nitride layer 18 that are no longer protected by the photo resist 50, effectively reducing the width of nitride layer by about 600 Å. A poly etch step is used to remove the exposed portions of poly layer 14 that are not protected by oxide layer 16, as illustrated in FIG. 3C. The photo resist 50 is then removed, resulting in the structure shown in FIG. 3D. It should be noted that instead of using a plasma etch to narrow the width of the photo resist, with a subsequent anisotropic nitride etch, an isotropic nitride etch process could alternately be used to narrow the width of nitride layer 18.

Figure 3E:
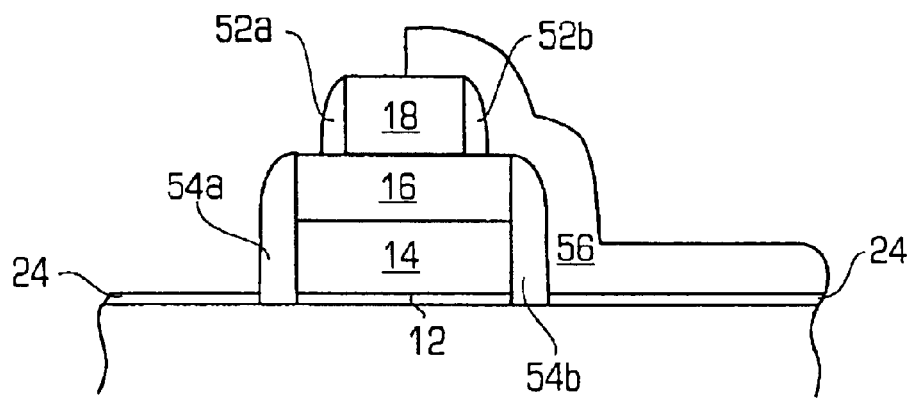

Insulation spacers 52a/52b are formed along the side wall surfaces of nitride layer 18, and spacers 54a/54b are formed along side wall surfaces of layers 12/14/16, by performing a wet etch to remove exposed portions of oxide layer 12 and by depositing a layer of oxide on exposed surfaces of the structure (~550 Å thickness using an HTO deposition process), followed by an anisotropic oxide etch process. The structure is then oxidized to form the oxide layer 24 on the exposed portions of the substrate 10. A layer of polysilicon 56 is deposited over the structure (~800 Å thick), which is then implanted with $P_{31}$ (4 E14 at 15 KeV). A masking step is used to protect half the structure, so that a poly etch step can be used to remove the portion of the deposited poly layer 56 disposed over the unprotected half of the structure. The resulting structure is shown in FIG. 3E.

Figure 3F:
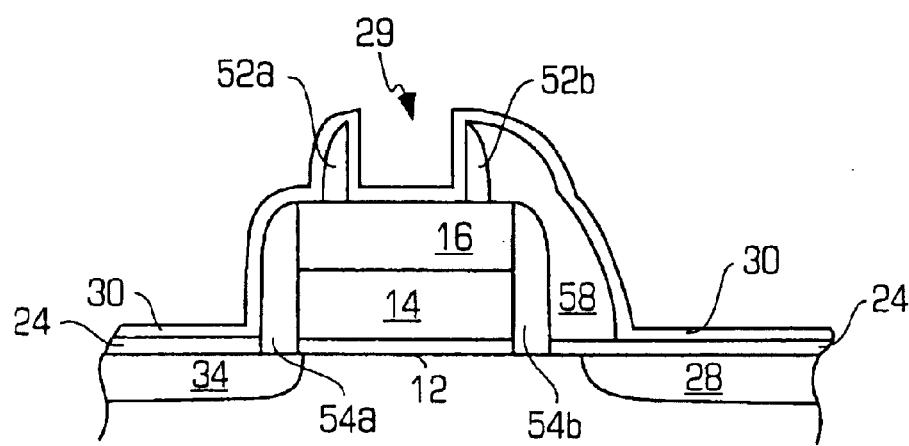

Another poly etch step is performed to reduce poly layer 56 to a poly spacer 58 disposed against the sides of oxide spacers 52b/54b. A nitride etch (hot $H_3PO_4$) is then used to remove nitride layer 18, leaving recess 29 over oxide layer 16 and between spacers 52a/52b. The ONO layer 30 is then formed over the structure by successive oxide and nitride deposition steps, which is followed by an ion implant (5 E13 of $P_{31}$ at 30 KeV, 15°; and 2 E15 of As at 60 KeV, 0°) and anneal process (850° C. with $N_2$ for 30 minutes) to form the source and drain regions 28/34 in the substrate on either side of the structure. The resulting structure is shown in FIG. 3F.

Figure 3G:
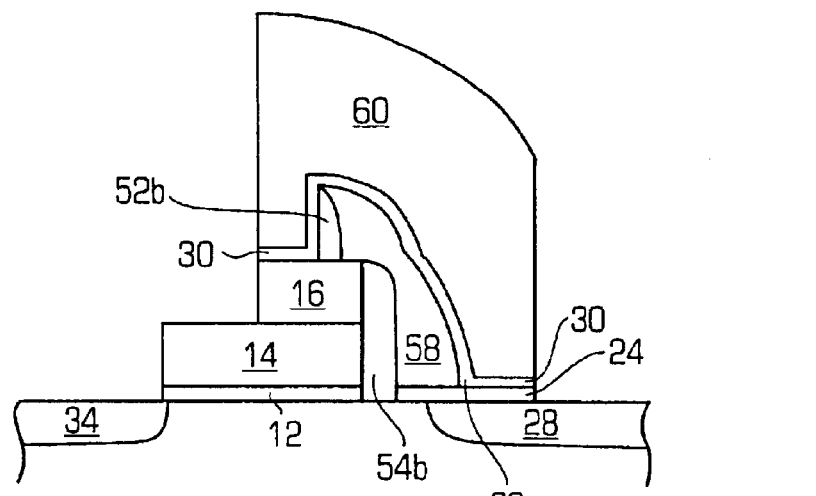

A poly layer 60 is next formed over the structure (~2200 Å thick). A masking step is used to protect the half of the structure containing the poly spacer 58, so that a poly etch step can be used to remove the portion of the deposited poly layer 60 disposed over the unprotected half of the structure. A series of dry oxide and nitride etches are then used to remove the exposed portions of the ONO layer 30 and the oxide layers 16 and 24, as well as oxide spacers 52a and 54a. After the masking material is removed, the resulting structure is shown in FIG. 3G.

A layer of (TEOS) oxide 62 is then formed over the structure. Nitride spacers 64a and 64b are formed adjacent to poly and oxide layers 60/16 and adjacent poly layer 14, respectively, and nitride spacer 65 is formed adjacent poly layer 60, by a nitride deposition (~800 Å thick) and etch back process. An oxide etch follows to remove the exposed portions of oxide layer 62. Poly layer 60 is then implanted with As (5 E15 dose, 50 KeV implant energy) and annealed (at 950° C. with $N_2$ for 30 seconds).

Figure 3H:
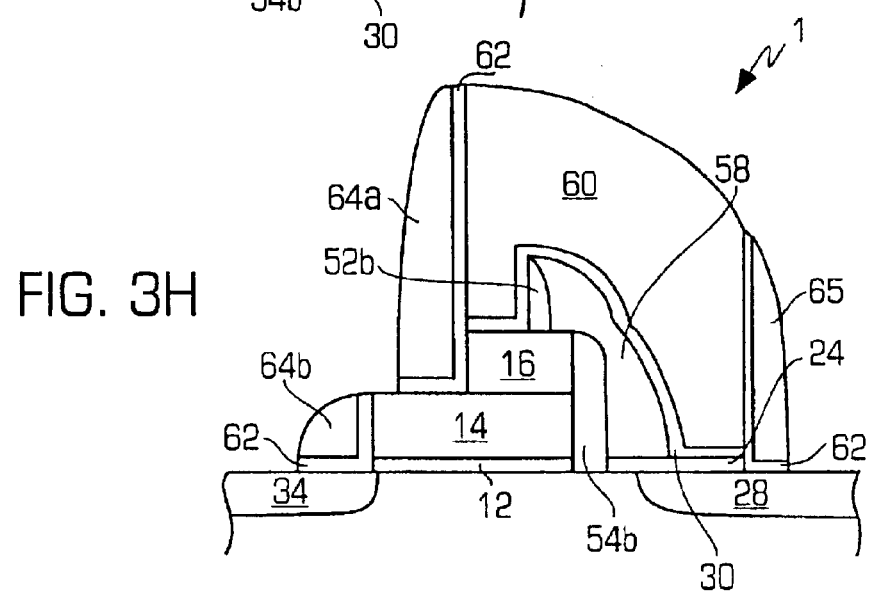
Figure 3I:
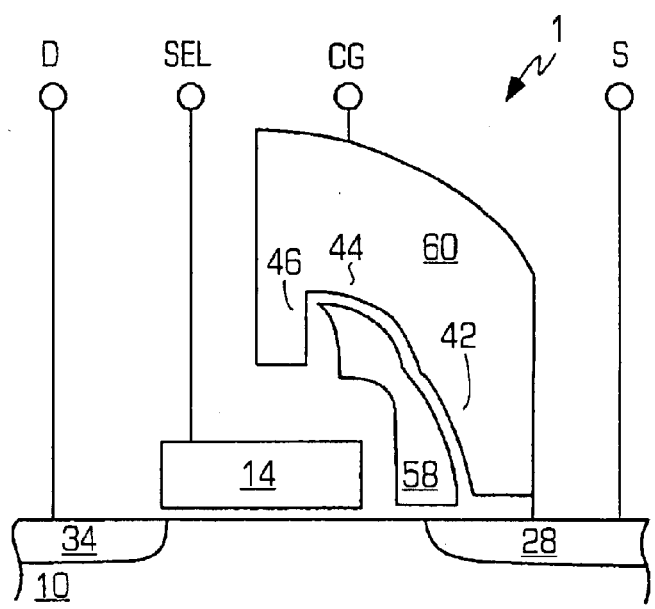
FIG. 3I is a schematic cross sectional view the memory cell of the present invention fabricated by the second alternate embodiment of the processing steps of the present invention.

The final memory cell structure is shown in FIG. 3H and FIG. 3I (simplified view showing the five conductive memory cell components). This memory cell embodiment has the same basic features as the previous embodiments. Namely, the control gate 60 wraps around the spacer forming the floating gate 58 for enhanced coupling therebetween. Control gate 60 includes a first portion 42 disposed adjacent to a first side of floating gate 58, a second portion 44 disposed over floating gate 58, and a third portion 46 disposed adjacent to a second side of floating gate 58 that opposes the floating gate first side. Thus, this configuration enhances coupling, and the fine tuning of the enhanced coupling, between the control gate 60 and floating gate 58 as described previously with the above described embodiments. However, the floating gate spacer 58 of this embodiment extends over the select gate 14, which provides additional surface area on the floating gate 58, as well as on that portion of the control gate 60 wrapped around the floating gate, for additional enhancement of capacitive coupling therebetween.

Third Alternate Embodiment

Figure 4A:
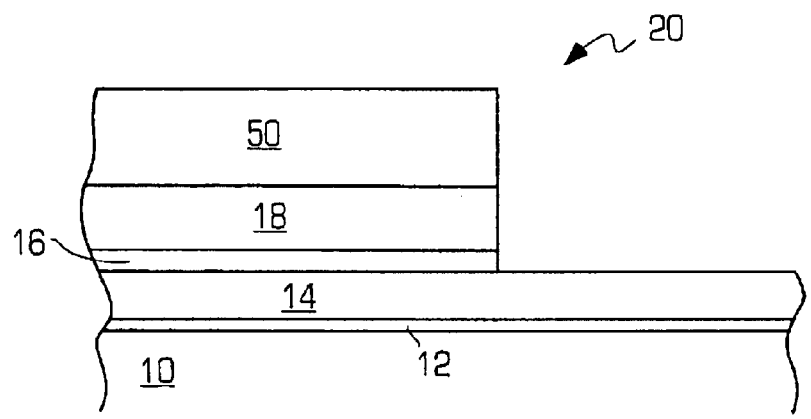
FIGS. 4A to 4H are cross sectional views of a substrate showing in sequence a third alternate embodiment of the processing steps used to fabricate the memory cell of the present invention.

FIGS. 4A to 4I illustrate a third alternate method of fabricating a third alternate embodiment of the non-volatile memory cell structure having a floating gate overlapping with the select gate. This third alternate method uses many of the same processing steps and parameters as disclosed above with regard to FIGS. 3A to 3I, with exceptions noted below. The third alternate method begins with the same materials depositions steps for forming the layered structure of oxide 12, poly 14, oxide 16 and nitride 18 over the substrate 10. A suitable photo-resistant material 50 is then applied on the nitride layer 18, and a masking step is performed to selectively remove the photo-resistant material from certain masking regions (stripes 20 extending in a row direction across multiple columns of active regions). Where the photo-resist material is removed, the underlying nitride 18 and oxide 16 are etched away in stripes 20 using standard etching techniques (i.e. anisotropic etch processes using poly layer 14 as the etch stop). Where the photo resist 50 is not removed, the layers of nitride 18 and oxide 16 are maintained. However, unlike the previously described method that performs a masking step to etch away material from masking regions 20 on both sides of the layered structure, only a single masking region 20 is defined for each memory cell on one side of the layered structure from which the layered materials are removed, as shown in FIG. 4A.

Figure 4B:
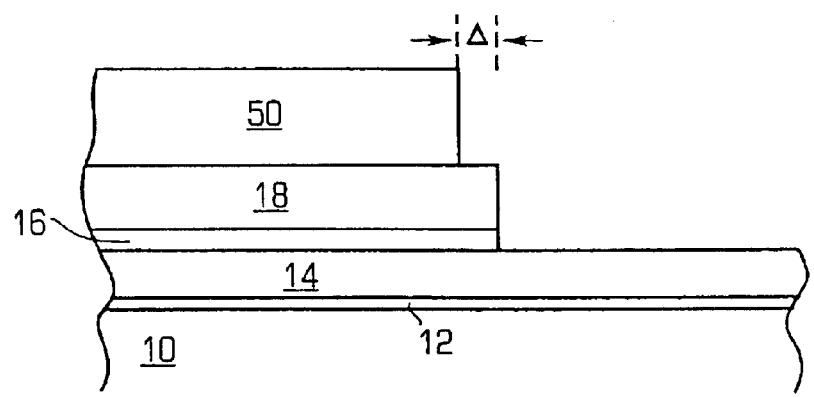
Figure 4C:
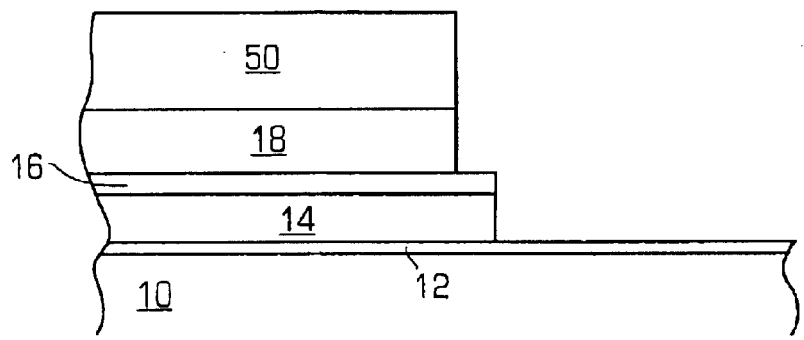
Figure 4D:
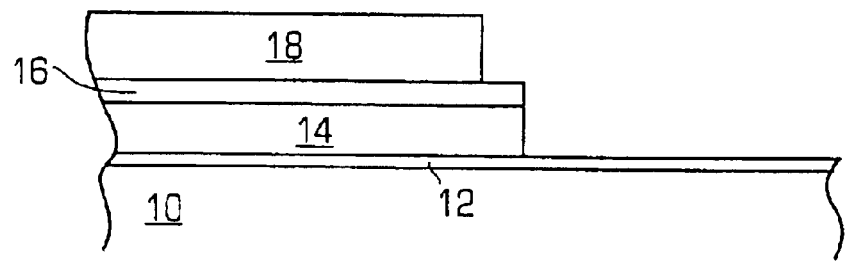
Figure 4E:
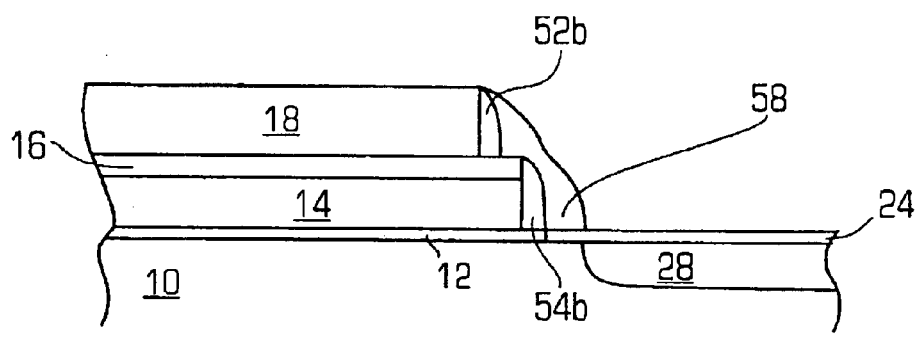

A plasma etching process (ashing) follows, which removes the exposed surfaces of the photo resist 50 on top of nitride layer 18. This etching process results in the formation of a gap Δ of about 600 Å between the edges of the photo resist 50 and nitride layer 18, and leaves a portion of nitride layer 18 exposed, as shown in FIG. 4B. A nitride etch follows to remove the exposed gap portion Δ of nitride layer 18 that is no longer protected by photo resist 50. A poly etch step is then used to remove the exposed portion of poly layer 14 that is not protected by oxide layer 16, as shown in FIG. 4C. The photo resist 50 is then removed, resulting in the structure shown in FIG. 4D. As with the previous embodiment, an isotropic nitride etch process could alternately be used to narrow the width of nitride layer 18.

Insulation spacer 52b is formed along the side wall surface of nitride layer 18, and spacer 54b is formed along side wall surfaces of layers 12/14/16, by depositing a layer of oxide on exposed surfaces of the structure, followed by an anisotropic oxide etch process. The structure is then oxidized to form the oxide layer 24 on the exposed portion of the substrate 10. Poly spacer 58 is then formed in the same manner as in second alternate embodiment (poly layer deposition, $P_{31}$ implant, masking step to protect half of structure, poly etch, photoresist removal, and another poly etch). An ion implant step follows to form the (N+) source region 28, resulting in the structure shown in FIG. 4E.

Figure 4F:
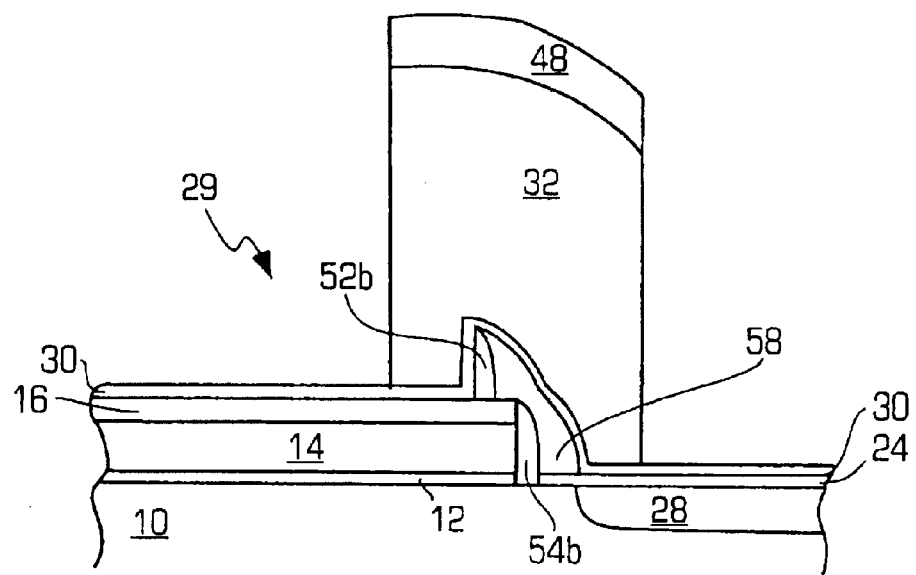
Figure 4G:
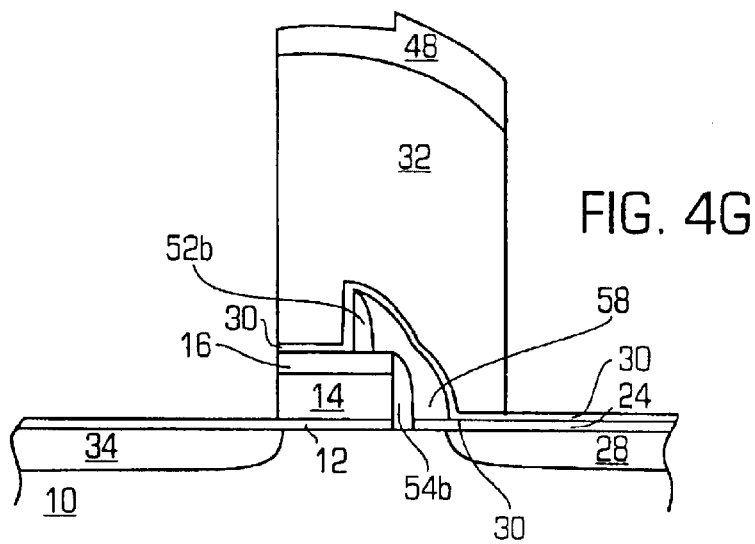

A nitride etch is used to remove nitride layer 18, leaving recess 29 over oxide layer 16 and extending away from spacer 52b. The ONO layer 30 is then formed over the structure by successive oxide and nitride deposition steps, which is followed by the deposition of a thick layer of polysilicon 32 (~2200 Å) over the structure. A nitride layer 48 is then formed over the poly layer 32. A masking step follows to protect that portion of the deposited polysilicon 32 that surrounds poly spacer 58. The unprotected portions of the deposited nitride 48 and polysilicon 32 are removed in nitride and poly etch steps, leaving poly block 32 (and nitride layer 48 thereon) disposed over and adjacent poly spacer 58 (insulated therefrom by ONO layer 30 and oxide spacer 52b). The resulting structure is shown in FIG. 4F.

Next, the masking step is performed to protect the ONO and oxide layers 30/24 over the source region 28 (the protective masking also extends over part of the nitride layer 48). A series of etch steps are then performed to remove exposed portions of ONO layer 30, oxide layer 16, and poly layer 14 (exposing a portion of oxide layer 12) that are not protected by the masking step and nitride layer 48. These etching steps also remove a portion of nitride layer 48. The low dopant second (drain) region 34 is then formed in the substrate 10 by ion implant of $P_{31}$ (30 KeV, 5 E13, 15°). The photo-resist material from the masking step is removed to result in the structure shown in FIG. 4G.

Figure 4H:
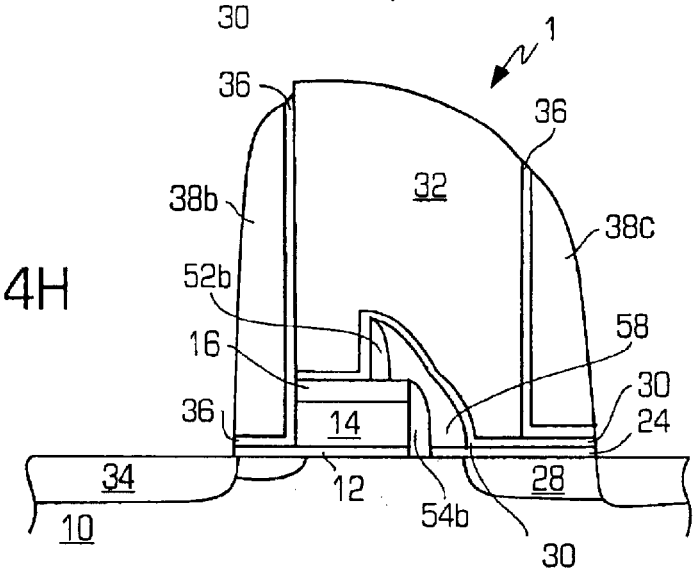
Figure 4I:
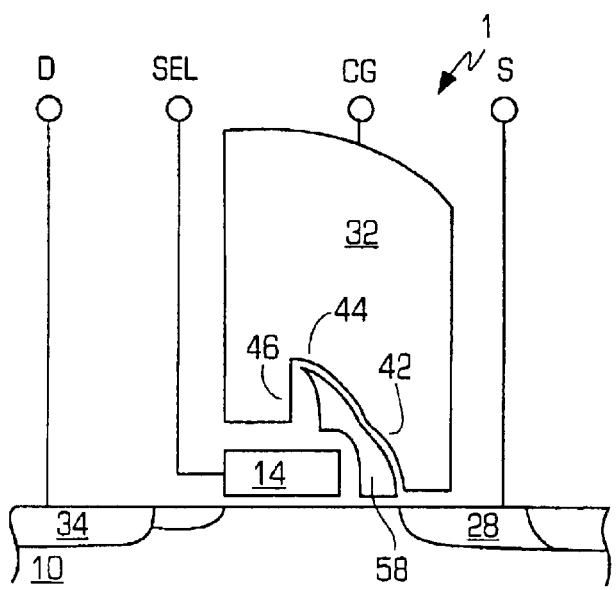
FIG. 4I is a schematic cross sectional view the memory cell of the present invention fabricated by the third alternate embodiment of the processing steps of the present invention.

Nitride layer 48 is then removed by a hot $H_3PO_4$ acid etch. A (TEOS) oxide layer 36 (~200 Å) is then deposited over the structure. Nitride spacers 38b and 38c are formed adjacent to poly block 32 and against oxide layer 36 by a nitride deposition (~800 Å) and etch back process. A series of oxide and nitride etches follow to remove the exposed portions of oxide layers 36, 30, 24 and 12. Additional ion implantation (As, 50 KeV, 5 E15) and anneal (950° C., $N_2$, 60 seconds) are performed to create higher N+ dopant regions in the source and drain regions 28/34. The final memory cell structure is shown in FIG. 4H and FIG. 4I (simplified view showing the five conductive memory cell components). This embodiment has all the advantages of the previous embodiment, and as well as having the side edges of poly block 32 and select gate 14 over drain region 34 be self aligned to each other.

As previously stated, the above method descriptions illustrate the formation of single memory cells, which are formed simultaneously that extend end to end in active regions arranged in columns. However, all of the above described memory cell embodiments can be formed as pairs of memory cells that mirror each other, whereby the memory cell pairs extend end to end in the active region columns. Such a configuration efficiently utilizes space on the silicon wafer, and the enlarged size of the control gates reduce the electrical resistance thereof. To form the above described memory cells as mirror pairs of such cells, only the applied masking steps need modification, while the same process steps are used.

Figure 5A:
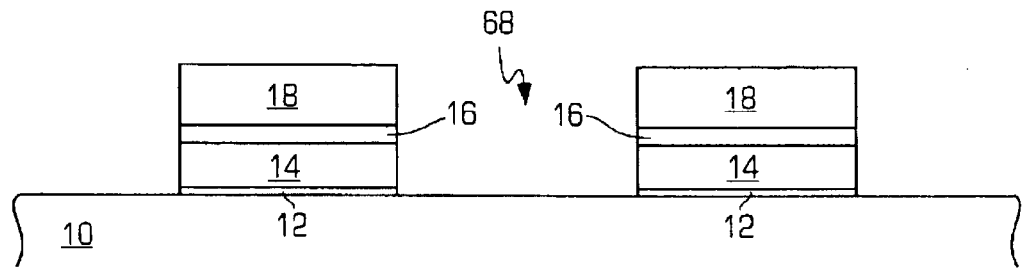
FIGS. 5A to 5E are cross sectional views of memory cells fabricated with similar processing steps as those illustrated in FIGS. 1A to 1E, but with altered masking steps to form mirror sets of memory cells.
Figure 5B:
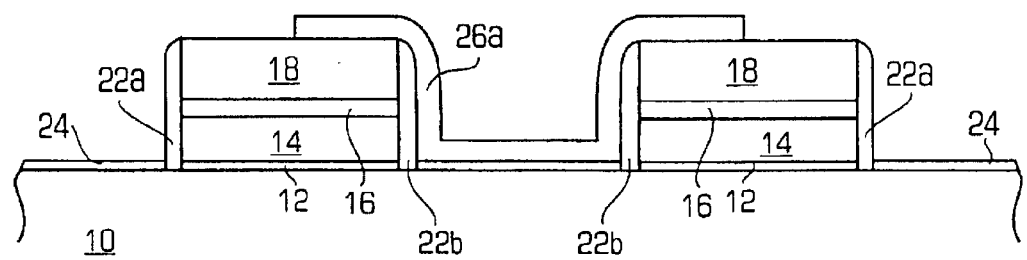
Figure 5C:
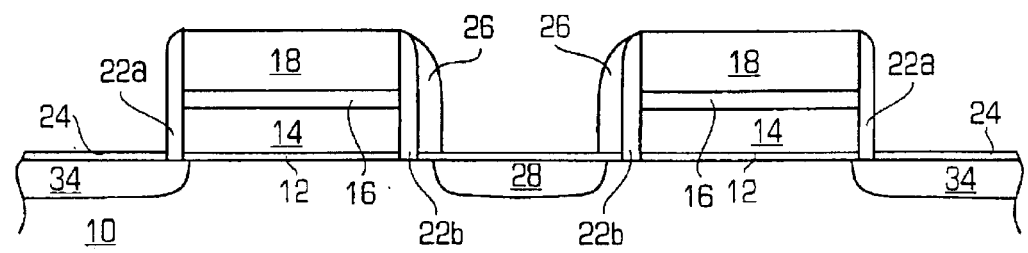
Figure 5D:
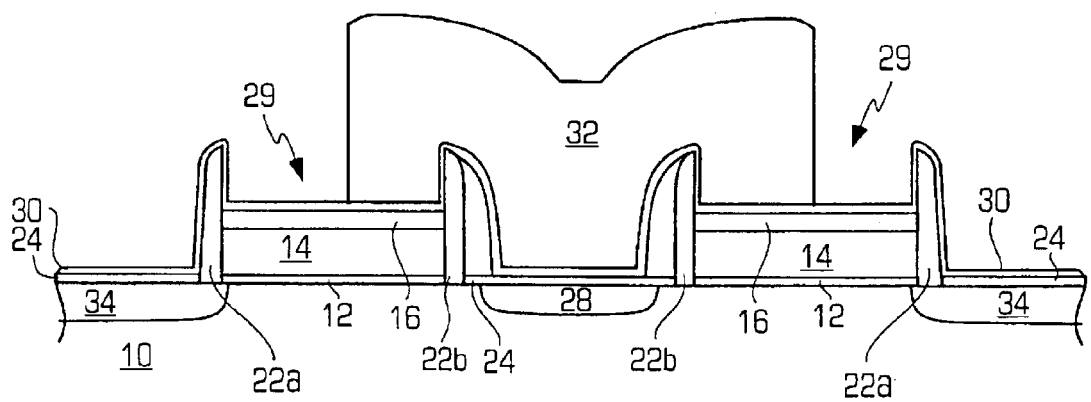
Figure 5E:
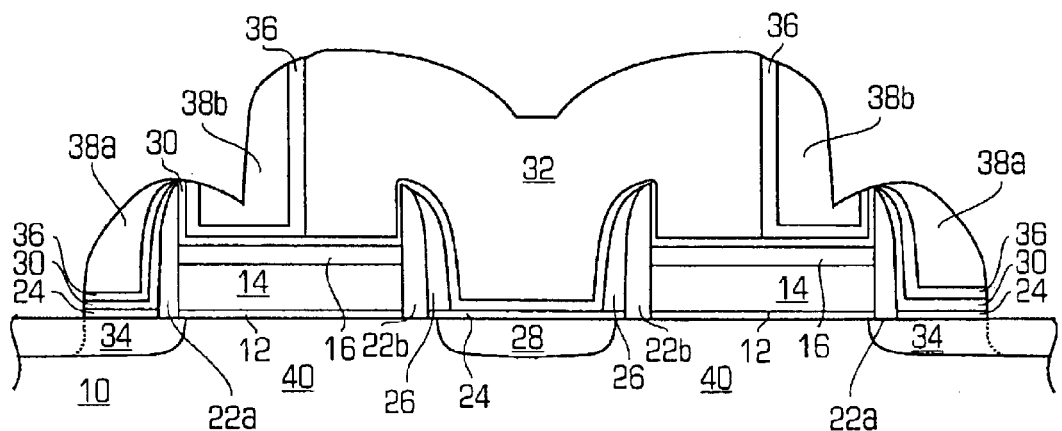
Figure 5F:
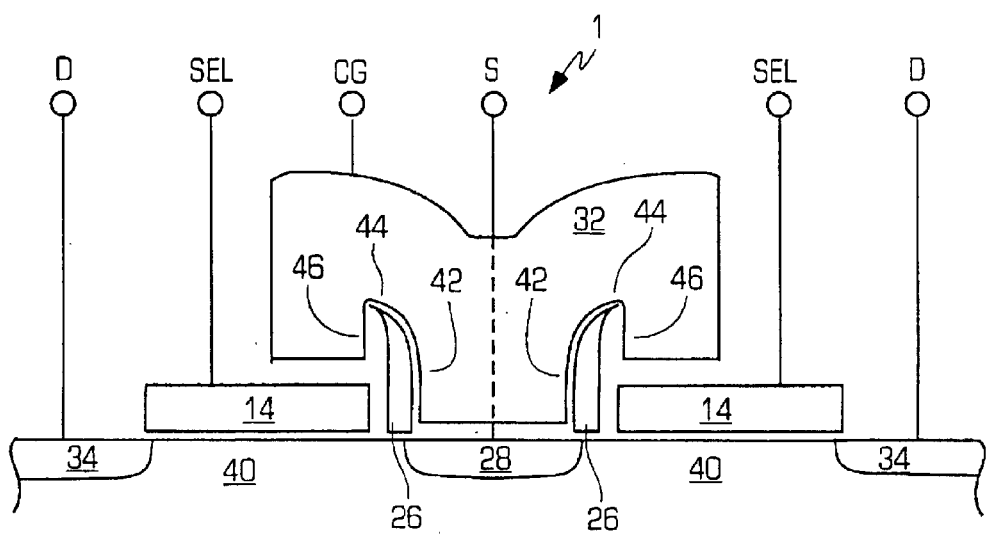
FIG. 5F is a schematic cross sectional view the mirror set of memory cells of FIG. 5E.

For example, FIGS. 5A–5F illustrate the same processing steps as used to form the first embodiment of FIGS. 1A–1F, except for a few masking step changes. Specifically, as shown in FIG. 5A, the first masking step used to form the block structure of oxide 12, poly 14, oxide 16 and nitride 18 is modified to form pairs of such block structures, with a trench 68 formed therebetween. The masking step used to define poly segment 26a is modified so that poly segment 26a extends over the pair of block structures, and the trench 68 therebetween, as shown in FIG. 5B. The masking step used to define poly block 32 is modified so that poly block 32 extends over the pair of block structures, as shown in FIG. 5D. The final structure is illustrated in FIG. 5E and FIG. 5F (simplified schematic view showing the five conductive components of the memory cell). The mirror pair of memory cells share a common source region 28 and a common control gate 32.

Figure 6A:
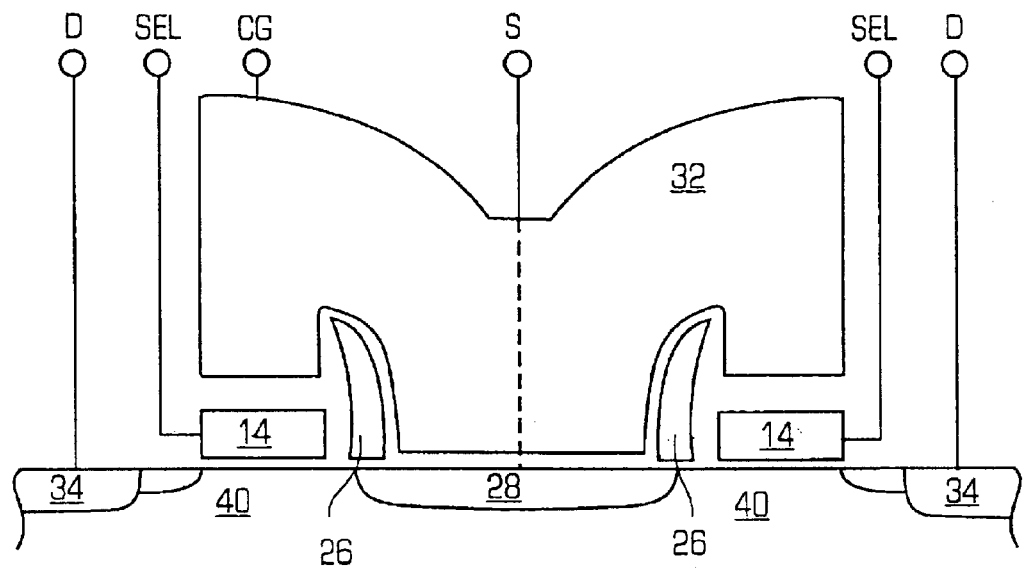
FIG. 6A is a schematic cross sectional view of the mirror pair of memory cells fabricated by similar processing steps as those illustrated in FIGS. 2A to 2E, but with altered masking steps.
Figure 6B:
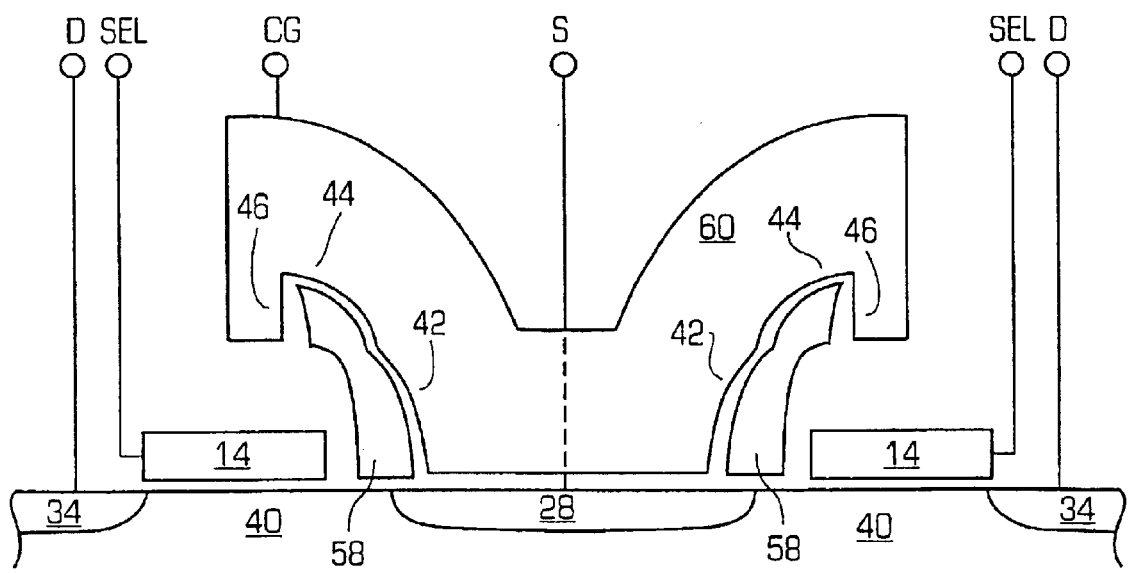
FIG. 6B is a schematic cross sectional view of the mirror pair of memory cells fabricated by similar processing steps as those illustrated in FIGS. 3A to 3H, but with altered masking steps.
Figure 6C:
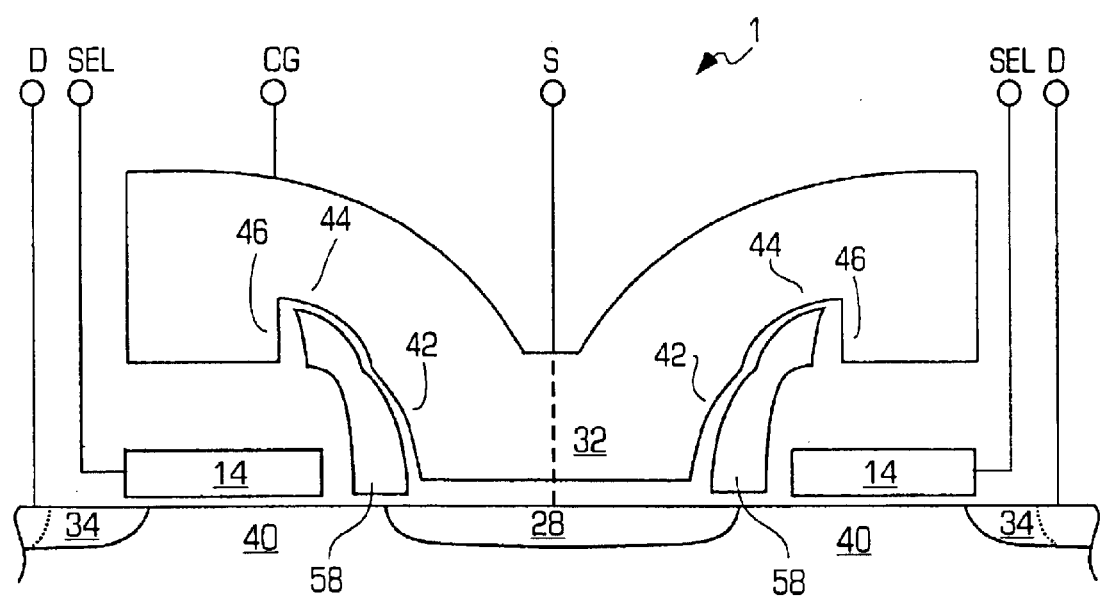
FIG. 6C is a schematic cross sectional view of the mirror pair of memory cells fabricated by similar processing steps as those illustrated in FIGS. 4A to 4H, but with altered masking steps.

Similar masking changes can be made to the methods of the first alternate embodiment of FIGS. 2A–2F, the second alternate embodiment of FIGS. 3A–3I, and the third alternate embodiment of FIGS. 4A–4I to form the memory cells as mirror pairs of memory cells. Specifically, the first masking step used to form the block structure of oxide 12, poly 14, oxide 16 and nitride 18 in any of the embodiments is modified to form pairs of such block structures. The masking step used to define poly segment 56 in the second alternate embodiment (FIG. 3E) is modified so that poly segment 56 extends over the pair of block structures, and the trench 68 therebetween. Finally, the masking step used to define poly block 32/60 in any of the embodiments is modified so that it extends over the pair of block structures. The formation of nitride layer 48, and the last masking step used to protect the portions of the ONO and oxide layers 30/24 disposed over the source region 28, in the first and third alternate embodiments would be skipped. FIGS. 6A, 6B and 6C illustrate the final memory cell structures of the first, second and third alternate embodiments, respectively, when formed as pairs of mirror memory cells.

It is to be understood that the present invention is not limited to the embodiments described above and illustrated herein, but encompasses any and all variations falling within the scope of the appended claims. For example, although the foregoing methods describes the use of appropriately doped polysilicon as the conductive material used to form the memory cells, it should be clear to those having ordinary skill in the art that any appropriate conductive material can be used. In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Further, as is apparent from the claims, not all method steps need be performed in the exact order illustrated or claimed, but rather in any order that allows the proper formation of the memory cell of the present invention. Additionally, those skilled in the art understand that the source and drain regions are interchangeable during the operation of the memory cell. Lastly, single layers of insulating or conductive material could be formed as multiple layers of such materials, and vice versa.

What is claimed is:

1. A method of making a memory device on a semiconductor substrate of a first conductivity type, comprising the steps of:

forming spaced-apart first and second regions in the substrate that have a second conductivity type different from the first conductivity type, wherein a channel region is defined in the substrate between the first and second regions;

forming a conductive select gate over and insulated from the substrate, wherein the select gate extends over a first portion of the channel and has a first height;

forming a conductive floating gate spacer over and insulated from the substrate, wherein the floating gate includes:
    a bottom surface extending over a second portion of the channel region, and
    first and second side surfaces extending from the bottom surface to a height greater than the first height; and forming a conductive control gate over and insulated from the floating gate, wherein the control gate includes a first portion disposed adjacent to the first floating gate side surface and a second portion disposed adjacent to the second floating gate side surface.

2. The method of claim 1, wherein the floating gate second side surface includes:
    a first portion disposed adjacent to and insulated from a side surface of the select gate; and
    a second portion disposed adjacent to and insulated from the control gate second portion.

3. The method of claim 2, wherein the second portion of the floating gate second side surface is disposed over and is insulated from the select gate.

4. The method of claim 2, further comprising the step of:
    forming a first spacer of insulation material between the select gate side surface and the first portion of the floating gate second side surface.

5. The method of claim 4, wherein the first spacer is further formed between the control gate second portion and the second portion of the floating gate second side surface.

6. The method of claim 4, further comprising the step of:
    forming a second spacer of insulation material between the control gate second portion and the second portion of the floating gate second side surface.

7. The method of claim 1, wherein at least a portion of the floating gate bottom surface is disposed over and insulated from at least a portion of the first region.

8. The method of claim 1, wherein the control gate first portion is disposed over and insulated from the first region.

9. The method of claim 8, wherein the control gate portion is disposed over and insulated from the select gate.

10. The method of claim 1, wherein the control gate has a side surface aligned with a second side surface of the select gate.

11. The method of claim 1, wherein the formation of the control gate further includes the steps of:
    selecting a desired capacitive coupling ratio between the floating gate and the control gate; and
    forming the control gate second portion with a predetermined height for achieving the desired capacitive coupling ratio.

12. The method of claim 1, wherein the formation of the spaced apart first and second regions is performed simultaneously by the same ion implantation process.

13. A method of making a memory device on a semiconductor substrate of a first conductivity type, comprising the steps of:

forming spaced-apart first and second regions in the substrate that have a second conductivity type different from the first conductivity type, wherein a channel region is defined in the substrate between the first and second regions;

forming a first layer of insulating material on substrate;

forming a select gate on the first insulating layer, wherein the select gate is positioned over a first portion of said channel;

forming a second layer of insulating material on the select gate;

forming a layer of material on the second layer of insulating material;
  forming a floating gate spacer of conductive material adjacent to and insulated from the select gate and adjacent to the layer of material, wherein the floating gate includes:
    a bottom surface extending over a second portion of the channel region, and
    first and second side surfaces extending from the bottom surface;
  removing the layer of material; and
  forming a conductive control gate over and insulated from the floating gate and over the second insulating layer, wherein the control gate includes a first portion disposed adjacent to and insulated from the first floating gate side surface and a second portion disposed adjacent to and insulated from the second floating gate side surface.

14. The method of claim 13, wherein the floating gate second side surface includes:
  a first portion disposed adjacent to and insulated from a side surface of the select gate; and
  a second portion disposed adjacent to and insulated from the control gate second portion.

15. The method of claim 14, further comprising the step of:
  removing a side portion of the layer of material before the formation of the floating gate spacer, so that the second portion of the floating gate second side surface extends over the select gate.

16. The method of claim 14, wherein:
  the removal of the layer of material forms a recess over the second layer of insulating material and adjacent to the second portion of the floating gate second side surface; and
  the formation of the control gate includes filling at least a portion of the recess with conductive material to form the second portion of the control gate.

17. The method of claim 16, further comprising the step of:
  selecting a size of the control gate second portion by selecting a thickness of the layer of material for dictating the size of the recess filled by the control gate second portion.

18. The method of claim 14, wherein the second portion of the floating gate second side surface is disposed over and is insulated from the select gate.

19. The method of claim 14, further comprising the step of:
  forming a first spacer of insulation material between the select gate side surface and the first portion of the floating gate second side surface.

20. The method of claim 19, wherein the first spacer is further formed between the control gate second portion and the second portion of the floating gate second side surface.

21. The method of claim 19, further comprising the step of:
  forming a second spacer of insulation material between the control gate second portion and the second portion of the floating gate second side surface.

22. The method of claim 13, wherein at least a portion of the floating gate bottom surface is disposed over and insulated from at least a portion of the first region.

23. The method of claim 22, wherein the control gate first portion is disposed over and insulated over and insulated from the first region.

24. The method of claim 23, wherein the control gate second portion is disposed over and insulated from the select gate.

25. The method of claim 13, wherein the control gate has a side surface aligned with a second side surface of the select gate.

26. The method of claim 13, wherein the formation of the control gate further includes the steps of:
  selecting a desired capacitive coupling ratio between the floating gate and the control gate; and
  forming the control gate second portion with a predetermined height for achieving the desired capacitive coupling ratio.

27. The method of claim 13, wherein the formation of the spaced apart first and second regions is performed simultaneously by the same ion implantation process.

28. A method of designing an electrically erasable and programmable memory device formed on a substrate of semiconductor material of a first conductivity type, the device including spaced-apart first and second regions formed in the substrate with a second conductivity type different from the first conductivity type and with a channel region therebetween, a conductive select gate formed over and insulated from the substrate and extending over a first portion of the channel, a conductive floating gate formed as a spacer over and insulated from the substrate and having a bottom surface extending over a second portion of the channel region and first and second side surfaces extending from the bottom surface, and a conductive control gate formed over and insulated from the floating gate with a first portion disposed adjacent to the first floating gate side surface and a second portion disposed adjacent to the second floating gate side surface, wherein the improvement comprises the steps of:
  selecting a desired capacitive coupling ratio between the floating gate and the control gate; and
  adjusting a height of the control gate second portion to achieve the desired capacitive coupling ratio.

* * * * *